US012040194B2

United States Patent
Viravaux et al.

(10) Patent No.: US 12,040,194 B2
(45) Date of Patent: Jul. 16, 2024

(54) METHOD FOR ETCHING SUBSTRATES COMPRISING A THIN SURFACE LAYER, FOR IMPROVING THE UNIFORMITY OF THICKNESS OF THE LAYER

(71) Applicant: Soitec, Bernin (FR)

(72) Inventors: Laurent Viravaux, Bernin (FR); Sébastien Carton, Bernin (FR); Onintza Ros, Bernin (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 17/757,408

(22) PCT Filed: Nov. 27, 2020

(86) PCT No.: PCT/FR2020/052205
§ 371 (c)(1),
(2) Date: Jun. 15, 2022

(87) PCT Pub. No.: WO2021/123529
PCT Pub. Date: Jun. 24, 2021

(65) Prior Publication Data
US 2023/0011691 A1 Jan. 12, 2023

(30) Foreign Application Priority Data

Dec. 17, 2019 (FR) .................................. 1914638

(51) Int. Cl.
*H01L 21/306* (2006.01)
*H01L 21/02* (2006.01)

(52) U.S. Cl.
CPC .... *H01L 21/30608* (2013.01); *H01L 21/0206* (2013.01)

(58) Field of Classification Search
CPC ........... H01L 21/30608; H01L 21/0206; H01L 21/02043; H01L 21/30604
(Continued)

(56) References Cited

U.S. PATENT DOCUMENTS 5,788,800 A 8/1998 Lee et al.
2003/0228760 A1* 12/2003 Shiraishi ........... H01L 21/31116
257/E21.252
(Continued)

FOREIGN PATENT DOCUMENTS

EP 2192610 A2 6/2010
WO 2004/015759 2/2004
WO 2013/003745 1/2013

OTHER PUBLICATIONS

International Search Report for International Application No. PCT/FR2020/052205 dated Mar. 22, 2021, 4 pages.
(Continued)

*Primary Examiner* — Duy Vu N Deo
(74) *Attorney, Agent, or Firm* — TraskBritt

(57) ABSTRACT

A method for etching a main surface of a thin layer of a substrate, which comprises immersing the substrate in an etching bath so as to expose the main surface to an etching agent, the substrate being oriented relative to the bath such that:—when it is introduced into the bath, the main surface is gradually immersed from an initial introduction point (PII) to an end introduction point (PFI), at an introduction speed, and—when it exits the bath, the main surface gradually emerges from an initial exit point (PIS) to an end exit point (PFS), at an exit speed, the method being characterized in that:—the introduction speed is chosen in such a way as to etch the main surface according to a first non-uniform profile between the initial introduction point (PII) and the end introduction point (PFI), and/or—the exit speed is chosen in such a way as to etch the main surface according to a second non-uniform profile between the initial exit point (PIS) and the end exit point (PFS), in order to compensate for non-uniformities in the thickness of the thin layer.

14 Claims, 6 Drawing Sheets

(58) Field of Classification Search
USPC .................................................. 438/745–754
See application file for complete search history.

(56) References Cited

U.S. PATENT DOCUMENTS

| | | | |
|---|---|---|---|
| 2005/0156239 A1* | 7/2005 | Seko ................. | H01L 29/78636 |
| | | | 438/164 |
| 2014/0234992 A1 | 8/2014 | Kubota et al. | |
| 2020/0243343 A1* | 7/2020 | Ikeno ................ | H01L 21/31111 |
| 2020/0279752 A1* | 9/2020 | Honda .............. | H01L 21/67086 |

OTHER PUBLICATIONS

International Written Opinion for International Application No. PCT/FR2020/052205 dated Mar. 22, 2021, 5 pages.

\* cited by examiner

METHOD FOR ETCHING SUBSTRATES COMPRISING A THIN SURFACE LAYER, FOR IMPROVING THE UNIFORMITY OF THICKNESS OF THE LAYER

CROSS-REFERENCE TO RELATED APPLICATIONS

This application is a national phase entry under 35 U.S.C. § 371 of International Patent Application PCT/FR2020/052205, filed Nov. 27, 2020, designating the United States of America and published as International Patent Publication WO 2021/123529 A1 on Jun. 24, 2021, which claims the benefit under Article 8 of the Patent Cooperation Treaty to French Patent Application Serial No. FR1914638, filed Dec. 17, 2019.

TECHNICAL FIELD

The present disclosure relates to the field of microelectronics, optoelectronics, photonics, etc. In particular, it relates to a method for etching substrates using a chemical-bath multi-wafer cleaner; the present disclosure is particularly suitable for SOI ("silicon-on-insulator") substrates comprising a very thin surface layer of silicon.

BACKGROUND

More and more applications based on SOI substrates require very high uniformity of thickness of the surface thin layer of silicon, (which is intended to accommodate components or to be their support). For example, in digital applications, the thin layer of FDSOI ("fully depleted SOI") substrates must exhibit very low variations in thickness because these affect the threshold voltage of transistors produced on the thin layer. In photonics applications, the performance of filter or modulator devices is also heavily affected by non-uniformities in the thickness of the thin layer of the SOI substrate.

The specifications in terms of thickness and uniformity are therefore becoming very demanding: for layers with thicknesses that are typically less than 50 nm, within-wafer (WiW) and wafer-to-wafer (WtW) non-uniformities of less than a few angstroms, typically less than 4 A, are expected. Such uniformities are difficult to achieve because the succession of steps in producing the SOI substrate results in a build-up of contributions to the non-uniformity of the thin layer.

One known solution for correcting non-uniformities in the thickness of the thin layer is to carry out localized etching of the layer, using plasma etch methods as described, for example, in document US20140234992, or using cluster-ion-beam etch methods as described, in particular, in document WO2013003745. However, this type of solution has a drawback: the etching of the surface of the thin layer creates a surface region of amorphous silicon, which is liable to cause electrical problems and which must therefore be removed. The removal of the amorphous region leads to an increase in surface roughness, which negatively affects the performance of the device produced on the thin layer.

Document WO2004015759 proposes an alternative solution, implementing localized sacrificial thermal oxidation, which locally consumes a greater or lesser thickness of the thin layer so as to correct its non-uniformities of thickness. The disadvantage of this approach is that a local temperature gradient is not easy to introduce into a silicon layer: the resolution of the correction of non-uniformities may therefore be limited.

BRIEF SUMMARY

The present disclosure relates to an alternative solution to those of the prior art, and aims to completely or partly overcome the aforementioned drawbacks. In particular, it relates to a method for preparing a thin layer with a view to achieving improved uniformity of thickness of the layer, the implementation of which method is straightforward and reproducible. Such a preparation method may advantageously be implemented to produce SOI structures with a very thin surface layer of silicon.

The present disclosure relates to a method for etching a main surface of a substrate comprising a surface thin layer, the main surface corresponding to the free face of the thin layer; the method comprises immersing the substrate in an etching bath so as to expose the main surface to an etchant, the substrate being oriented with respect to the bath such that:
  as it is introduced into the bath, the main surface is gradually immersed from an initial point of introduction to a final point of introduction, at a speed of introduction, and
  as it is removed from the bath, the main surface gradually emerges from an initial point of removal to a final point of removal, at a speed of removal,
The method is noteworthy in that:
  the speed of introduction is chosen so as to etch the main surface according to a first non-uniform profile between the initial point of introduction and the final point of introduction, and/or
  the speed of removal is chosen so as to etch the main surface according to a second non-uniform profile between the initial point of removal and the final point of removal,
  in order to compensate for non-uniformities in the thickness of the thin layer.

According to other advantageous and non-limiting features of the present disclosure, taken alone or in any technically feasible combination:
  the first etching profile defines a variation in thickness etched over the main surface, between the initial point of introduction and the final point of introduction, of greater than or equal to 0.15 nm, or even greater than or equal to 0.2 nm, and/or
  the second etching profile defines a variation in thickness etched over the main surface, between the initial point of removal and the final point of removal, of greater than or equal to 0.15 nm, or even greater than or equal to 0.2 nm;
  the initial point of introduction corresponds to the final point of removal, and the final point of introduction corresponds to the initial point of removal;
  the speed of introduction and/or the speed of removal are/is between 25 cm/s and 0.1 cm/s, preferably between 10 cm/s and 0.5 cm/s;
  the speed of introduction and/or the speed of removal are/is non-constant as the substrate is introduced into the bath and taken out of the bath, respectively;
  the etching bath contains an SC1 ("standard clean 1") solution, having ammonia, hydrogen peroxide and deionized water in proportions of 1/2/20, respectively;

the substrate is an SOI substrate whose surface thin layer has a thickness of less than 50 nm and is arranged on an insulating layer, which is arranged on a carrier substrate made of silicon;

the thin layer is made of monocrystalline silicon.

BRIEF DESCRIPTION OF THE FIGURES

Other features and advantages of the present disclosure will become apparent from the following detailed description of the present disclosure, which is given with reference to the accompanying figures, in which.

DETAILED DESCRIPTION

In the description, the same references in the figures may be used for elements of the same type. The figures are schematic representations, which, for the sake of legibility, are not to scale. In particular, the thicknesses of the layers along the z-axis are not to scale with respect to the lateral dimensions along the x- and y-axes; and the relative thicknesses of the layers with respect to one another have not necessarily been respected in the figures.

The present disclosure relates to a method for etching a main surface 1a of a substrate 1. The main surface 1a is, in particular, the front face of the substrate 1, that is to say the one whose physical properties (roughness, uniformity, cleanliness, etc.) are closely monitored with a view to the production of components.

The etching method is a wet etching method, and it comprises immersing the substrate 1 in a liquid etching bath 100 (FIG. 4A) so as to expose the main surface 1a to an etchant.

Figure 1A:
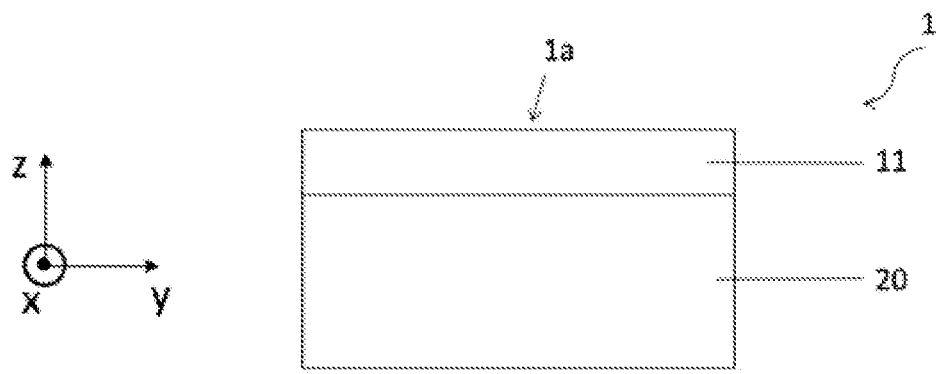
FIGS. 1A and 1B show substrates suitable for being treated with the production method according to the present disclosure.
Figure 1B:
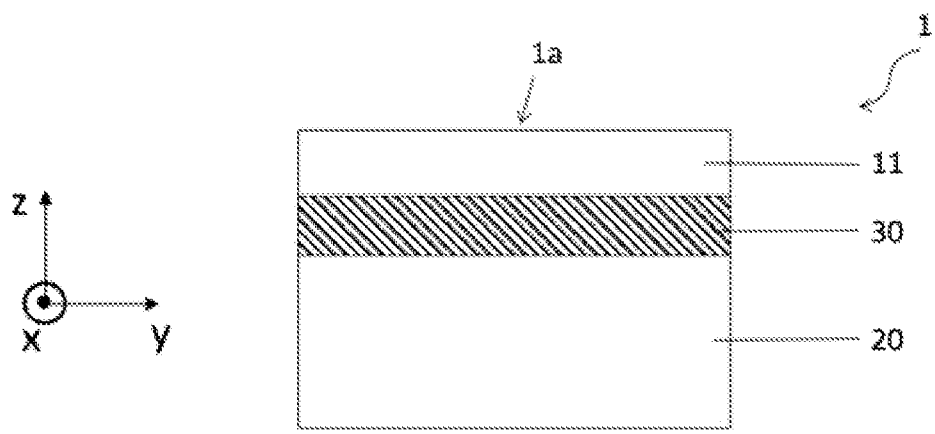

The present disclosure will be described in the particular case of a substrate 1 comprising a surface thin layer 11 arranged on a carrier substrate 20 (FIGS. 1A and 1B). The main surface 1a corresponds in this case to the free face of the thin layer 11 on which components are intended to be produced. The thin layer 11 is advantageously made of monocrystalline material with a very low defect density.

As is well known per se, the substrate 1 may be formed from the thin layer 11 directly arranged on the carrier substrate 20 (FIG. 1A) or it may comprise, between the thin layer 11 and the carrier substrate 20, an intermediate layer 30 (FIG. 1B). This intermediate layer 30 may be insulating as is the case for a substrate 1 of SOI type. Alternatively, it may be a semiconductor or conducting substrate, depending on the intended properties of the substrate 1.

Figure 2A:
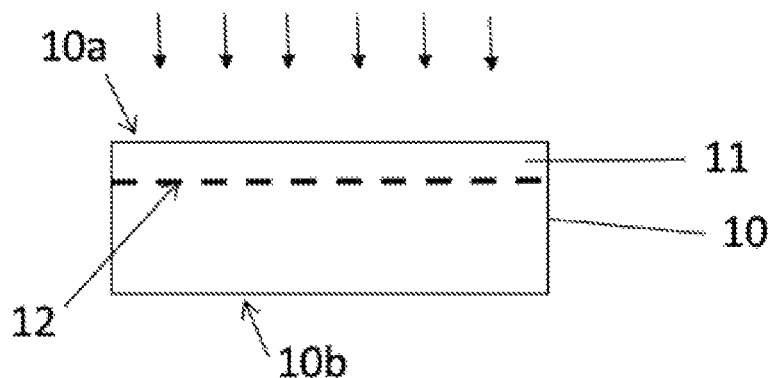
FIGS. 2A-2C show steps of a method for transferring a thin layer to a carrier substrate, known from the prior art.
Figure 2B:
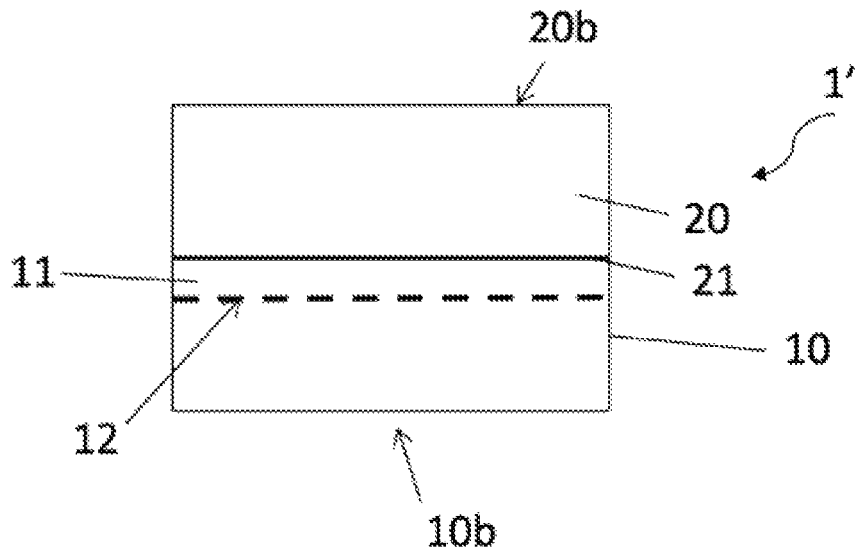

There are a number of known methods for transferring a monocrystalline thin layer 11 to a carrier substrate 20, including the SMARTCUT™ method, which is based on implanting light species in order to create a buried weakened plane 12 in a donor substrate 10 (FIG. 2A). The light species may be implanted through a front main surface 10a of the donor substrate 10, which also has a rear main surface 10b. This method is also based on direct bonding by molecular adhesion to form a bonding interface 21 between the two substrates 10, 20 and to join them together (FIG. 2B) and form a bonded structure 1', which has a first main surface defined by the rear main surface 10b of the donor substrate and a second main surface defined by a rear main surface 20b of the carrier substrate 20.

The donor 10 and carrier 20 substrates are preferably each in the form of a circular wafer having a diameter of 200 mm or 300 mm, or even 450 mm, and a thickness typically of between 500 and 900 microns.

Figure 2C:
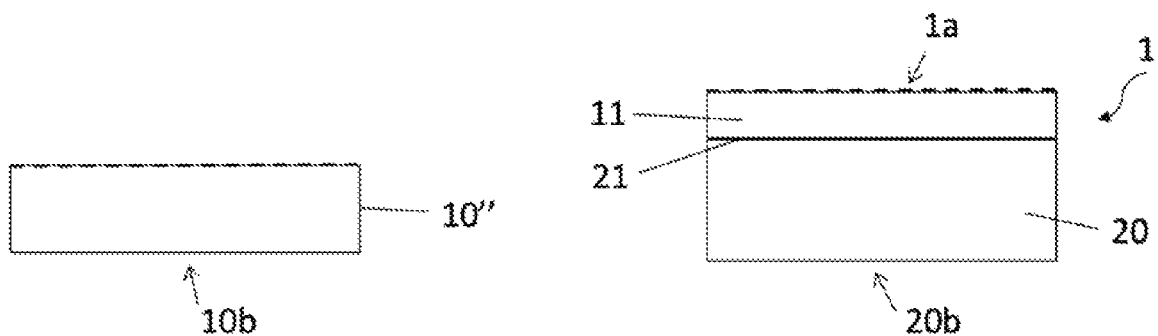

Of course, either (or both) of the substrates 10, 20 may comprise all or part of an intermediate layer 30 at its face to be joined, when such an intermediate layer 30 is required in the final stack of the substrate 1. Separating along the buried weakened plane 12 allows a thin layer 11 to be transferred from the donor substrate 10 to the carrier substrate 20 (FIG. 2C), the thin layer 11 being separated from a remainder 10" of the donor substrate 10. Just after separation, the free surface of the thin layer 11 exhibits a high level of roughness (on the order of 40 to 80 A, measured with an atomic force microscope, on a 30×30 micron scan). Among surface finishing techniques, it is possible, in particular, to implement sacrificial oxidation heat treatments, etching and/or surface reconstruction under a neutral or reducing atmosphere. These treatments are generally carried out at high temperatures, depending on the material constituting the thin layer 11. For example, for a silicon layer, oxidation may be carried out at between approximately 750° C. and 1100° C., and smoothing in a neutral or reducing atmosphere at between 950° C. and 1250° C.

Upon completion of these finishing treatments, a substrate 1 with its surface thin layer 11 is obtained. As mentioned in the introduction, the specifications in terms of uniformity of thickness of the thin layer 11 are becoming increasingly demanding, especially as the thickness thereof decreases.

It has been identified that the non-uniformity in the thickness of the thin layer 11 obtained using the SMARTCUT™ method, particularly in the case of thin layers 11 with very low thicknesses of less than 50 nm, or even less than 20 nm, is due, in particular, to two contributions of non-concentric symmetry.

The first contribution to the non-uniformity of the thin layer 11 comes from the natural variability in the multiple successive steps carried out to produce the substrate 1, and results in non-predictable ("random") variations in the thickness of the thin layer 11, which are, therefore, difficult to eliminate.

Figure 3:
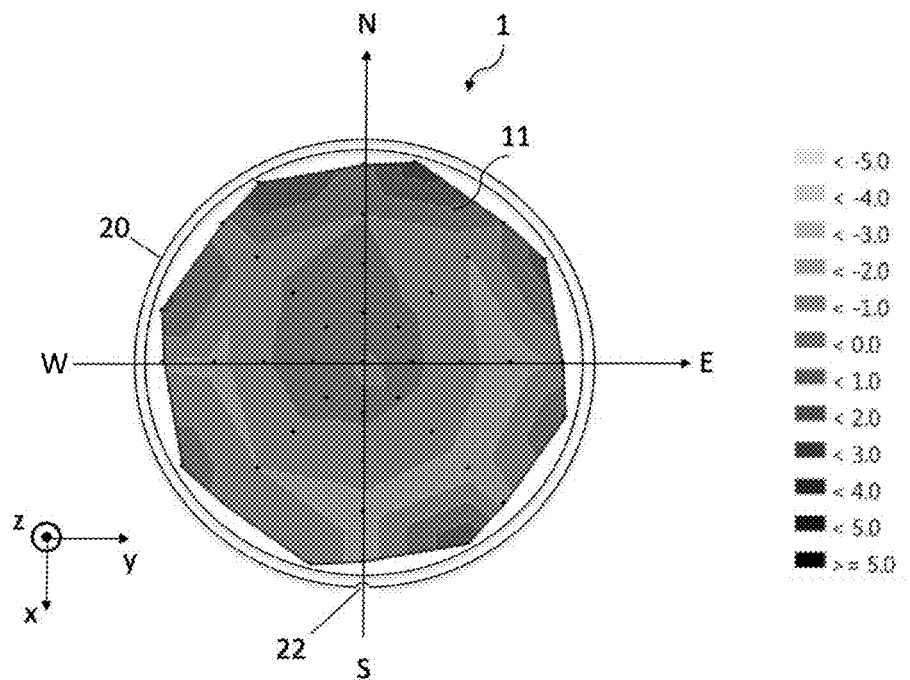
FIG. 3 shows a map of the non-uniformity in the thickness of an example of a thin layer of a substrate suitable for being treated with the production method according to the present disclosure.

The second contribution comes from production steps with non-concentric symmetry: for example, ion implantation, separation at the buried weakened plane and/or batch heat treatments, which involve supports holding the substrates 1 locally. This contribution creates more or less marked non-uniformities in the thickness of the thin layer 11 between cardinal points N, S, E, W of the substrate 1. For example, in FIG. 3, a non-uniformity in thickness on the order of 0.6 nm is visible between the two cardinal points N (North) and S (South), in the North-South direction. Note that the scale of values in FIG. 3 is in angstroms. The thin layer 11 is thinner near point S and thicker near point N. This non-uniformity profile is repeated substantially along all of the imaginary lines that could be drawn parallel to the North-South direction. In other words, the North region (region near point N) of the thin layer 11 appears thicker than the South region (near point S).

Note that the map of the non-uniformity in thickness in FIG. 3 is established based on measuring the thickness of the thin layer 11 by ellipsometry or reflectometry. In this example, the thin layer 11 is made of silicon and has an average thickness of 12 nm.

The aforementioned steps that generate non-uniformities with non-concentric symmetry are carried out in multi-wafer apparatuses simultaneously in batches of several tens, or even several hundreds, of substrates 1. To ensure traceability and reproducibility of performance in the various steps across various batches of substrates 1, it is common practice to arrange all of the substrates 1 in the same position, which is identifiable by the presence of a flat or a notch 22 made in the edge of each substrate 1. In practice, the notch will be at the top (North cardinal point) or at the bottom (South cardinal point—like in the example of FIG. 3) or at a defined angle between two of the cardinal points. Thus, the non-uniformity profile appears in a relatively reproducible manner across all of the substrates 1 of batches that are treated simultaneously or successively in the various steps.

The etching method according to the present disclosure addresses the second mentioned contribution to non-uniformity in thickness, in particular.

As mentioned above, the etching method aims to expose the main surface 1a of the substrate 1 to an etchant through immersion in an etching bath 100 containing a liquid solution.

Figure 4A:
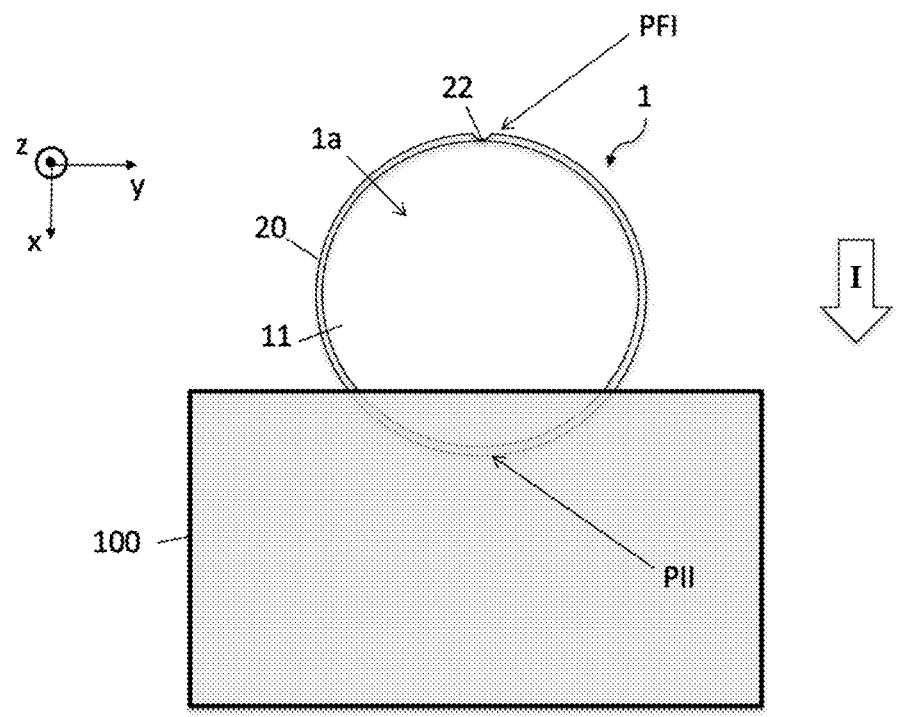
FIGS. 4A and 4B show simplified schematic illustrations of a substrate as it is introduced into an etching bath and as it is taken out of the etching bath, respectively, in an etching method according to the present disclosure.

The substrate 1 is oriented with respect to the etching bath 100 such that, as it is introduced I into the etching bath 100, the main surface 1a is gradually immersed from an initial point of introduction PII to a final point of introduction PFI, which reflects the total immersion of the substrate 1 (FIG. 4A). In other words, the main surface 1a forms a non-zero angle with the surface of the solution contained in the etching bath 100. Usually, this angle is of the order of 90°.

Figure 4B:
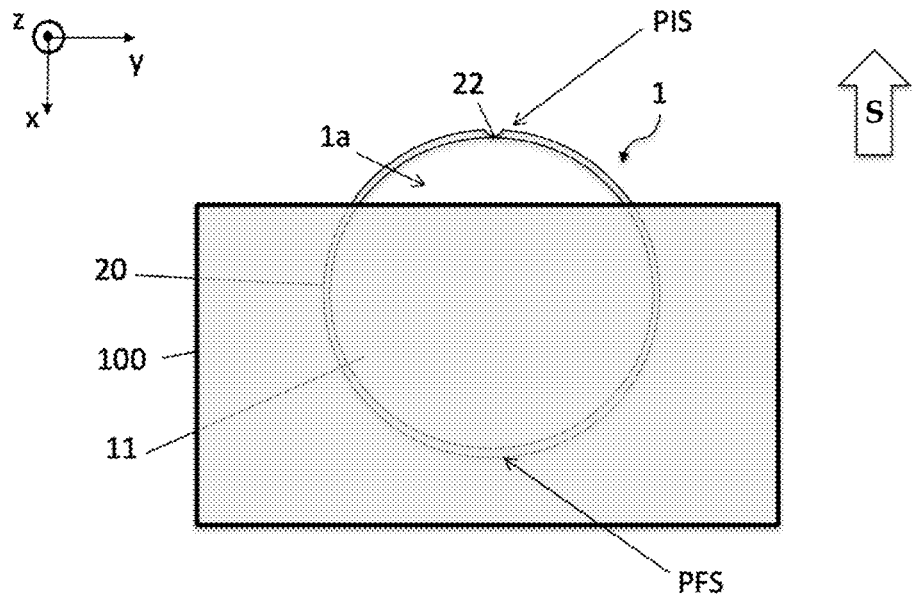

As it is removed S from the etching bath 100, the main surface 1a gradually emerges from an initial point of removal PIS to a final point of removal PFS, which reflects the total removal of the substrate 1 (FIG. 4B).

According to the etching method of the present disclosure, the speed of introduction of the substrate 1 into the etching bath 100 and/or the speed of removal of the substrate 1 from the etching bath 100 are/is chosen so as to create a non-uniform etching profile over the main surface 1a.

More particularly, the speed of introduction may be chosen so as to etch the main surface 1a according to a first non-uniform profile between the initial point of introduction PII and the final point of introduction PFI. Alternatively or in addition, the speed of removal may be chosen so as to etch the main surface 1a according to a second non-uniform profile between the initial point of removal PIS and the final point of removal PFS.

Advantageously, the first etching profile defines a variation (or gradient) in thickness etched over the main surface 1a, between the initial point of introduction PII and the final point of introduction PFI, of greater than or equal to 0.15 nm, or even greater than or equal to 0.2 nm.

Similarly, the second etching profile preferably defines a variation (or gradient) in thickness etched over the main surface 1a, between the initial point of removal PIS and the final point of removal PFS, of greater than or equal to 0.15 nm, or even greater than or equal to 0.2 nm.

The initial point of introduction PII may correspond to the final point of removal PFS, and the final point of introduction PFI may correspond to the initial point of removal PIS.

Optionally, to more finely adjust the non-uniform etching profiles to a particular type of non-uniformity in the thickness of the thin layer 11, a rotation by a defined angle could be applied to the substrate 1 so that the points of introduction PII, PFI and the points of removal PIS, PFS are different from one another.

According to yet another option, the etching method may be applied multiple consecutive times while rotating the substrate 1 between each of the iterations, in order to finely adjust the non-uniform etching profiles in each iteration to a particular type of non-uniformity in the thickness of the thin layer 11.

The speeds of introduction and of removal of the substrates 1 into and from a liquid-chemical-bath multi-wafer cleaning or etching apparatus are conventionally fast. For example, they are of the order of 30 cm/s for substrates of 300 mm in diameter. Each substrate 1, therefore, enters the bath in less than 2 seconds so as to obtain the best possible uniformity of treatment in the step.

Contrary to this principle, in the etching method of the present disclosure, at least one speed from between the speed of introduction and the speed of removal of the substrate 1 (or of the substrates 1) is advantageously reduced: it may be between 25 cm/s and 0.1 cm/s, or even, in particular, between 10 cm/s and 0.5 cm/s. As will be explained more particularly in one preferred embodiment below, reducing the speeds at which the substrate 1 is introduced into the etching bath 100 and/or is taken out of the etching bath 100 makes it possible to create non-uniform etching profiles and to compensate for the non-uniformities in the thickness of the thin layer 11 according to the aforementioned second contribution.

The speed of introduction and/or the speed of removal may also be chosen to be non-constant, in order to compensate for non-linear non-uniformity profiles over the diameter of the substrate 1.

According to one preferred embodiment, the thin layer 11 is made of monocrystalline silicon and the solution in the etching bath 100 is an SC1 ("standard clean 1") solution based on deionized water, ammonia ($NH_3$) and hydrogen peroxide ($H_2O_2$). The SC1 solution, which is typically used for cleaning silicon wafers, is particularly effective in removing particulate contamination from treated surfaces.

The etching method according to the present disclosure makes provision, for example, to use an SC1 solution with a speed of etching of the silicon thin layer 11 on the order of 0.5 nm/min. The respective volume ratios of the three compounds $NH_3/H_2O_2/H_2O$ of the solution are then 1/2/20, and the temperature of the bath is 70° C. Megasonic agitation of the solution is also favored.

Figure 5A:
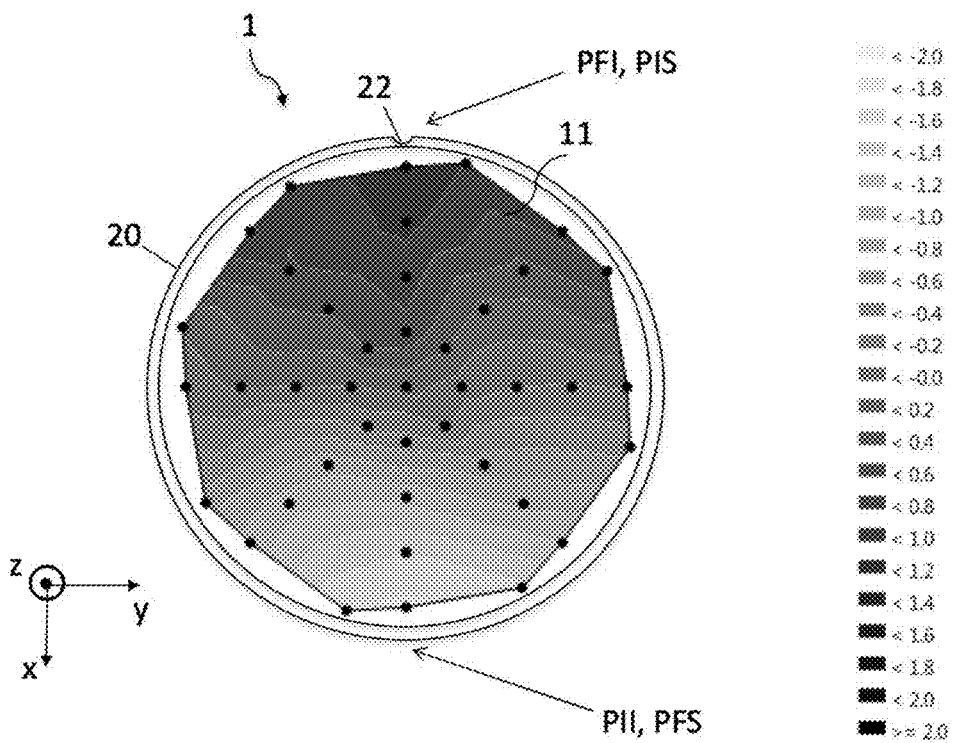
FIG. 5A shows a map of a non-uniform etching profile obtained from the etching method according to the present disclosure, over the thin layer of a substrate.

By way of example, FIG. 5A shows a non-uniform etching profile obtained over the thin layer 11 of a substrate 1 of 300 mm in diameter, in an etching bath SC1 as above, with a speed of introduction of the substrate 1 into the bath of 23 cm/s, a dwell time in the bath of 90 s, and a speed of removal of 0.67 cm/s (i.e., 45 s between the emergence of the initial point of removal PIS and the emergence of the final point of removal PFS). In this example, the initial point of introduction PII is coincident with the final point of removal PFS, and the final point of introduction PFI is coincident with the initial point of removal PIS; the notch 22 is at the final point of introduction PFI (also initial point of removal PIS).

The speed of removal has been more particularly decreased; it is therefore as it is removed from the bath that the non-uniform etching profile of FIG. 5A (or second non-uniform etching profile as mentioned above) is essentially formed. The etched thickness gradient between the two points of introduction PII, PFI (or between the two points of removal PIS, PFS) is on the order of 3 A: the etched thickness is greater at the initial point of introduction PII (or final point of removal PFS) and less at the final point of introduction PFI (or initial point of removal PIS).

Figure 5B:
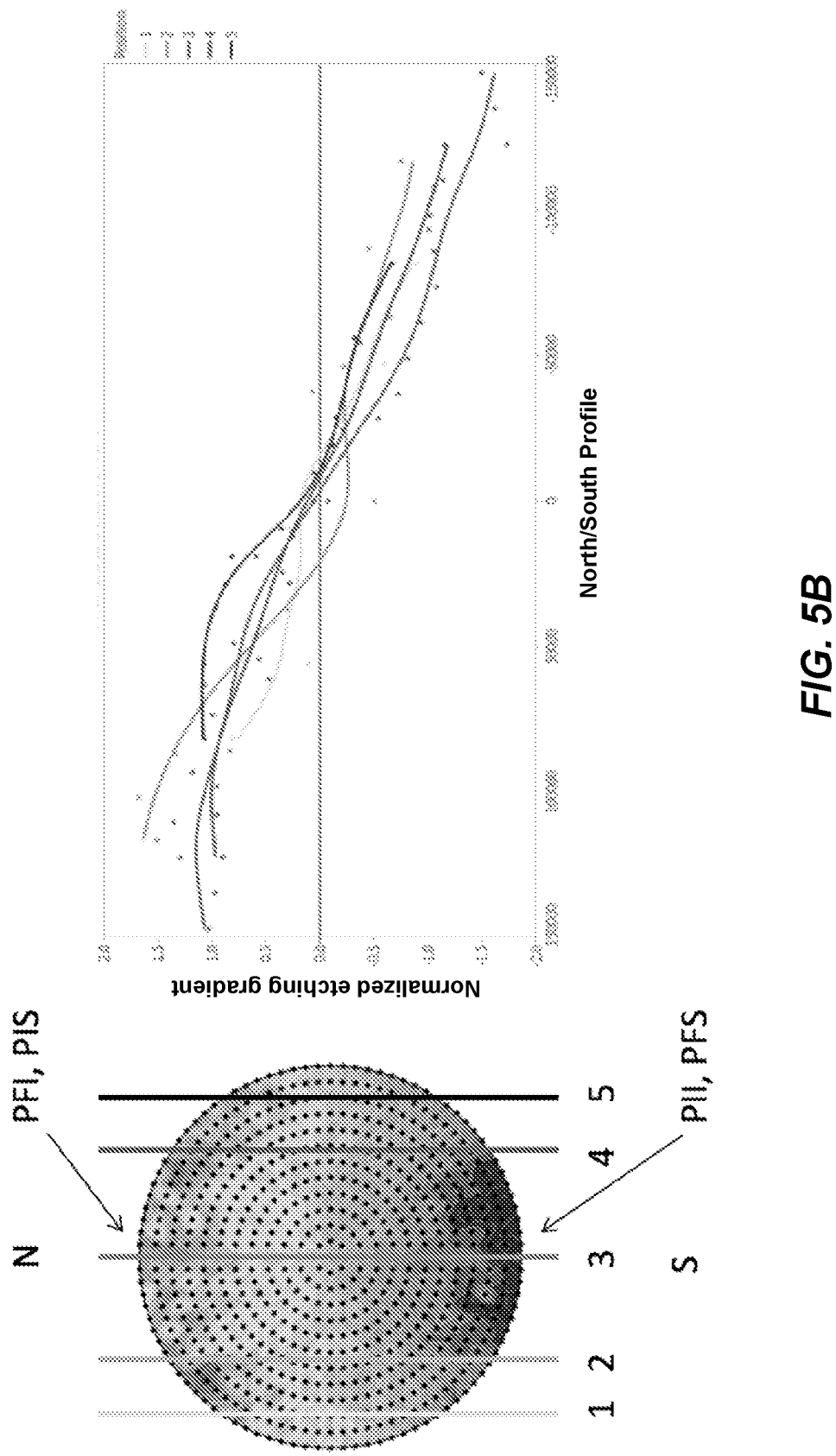
FIG. 5B shows the normalized etching gradient in north/south profiles along straight lines numbered from 1 to 5, obtained from the etching method according to the present disclosure, over the thin layer of a substrate.

FIG. 5B illustrates the normalized etching gradient in North/South profiles along straight lines numbered from 1 to 5, on a substrate 1 that has undergone the etching method according to the aforementioned example. It is found that the etched thickness gradient between the two points of introduction PII, PFI (or between the two points of removal PIS, PFS) is on the order of 3 A.

Figure 6:
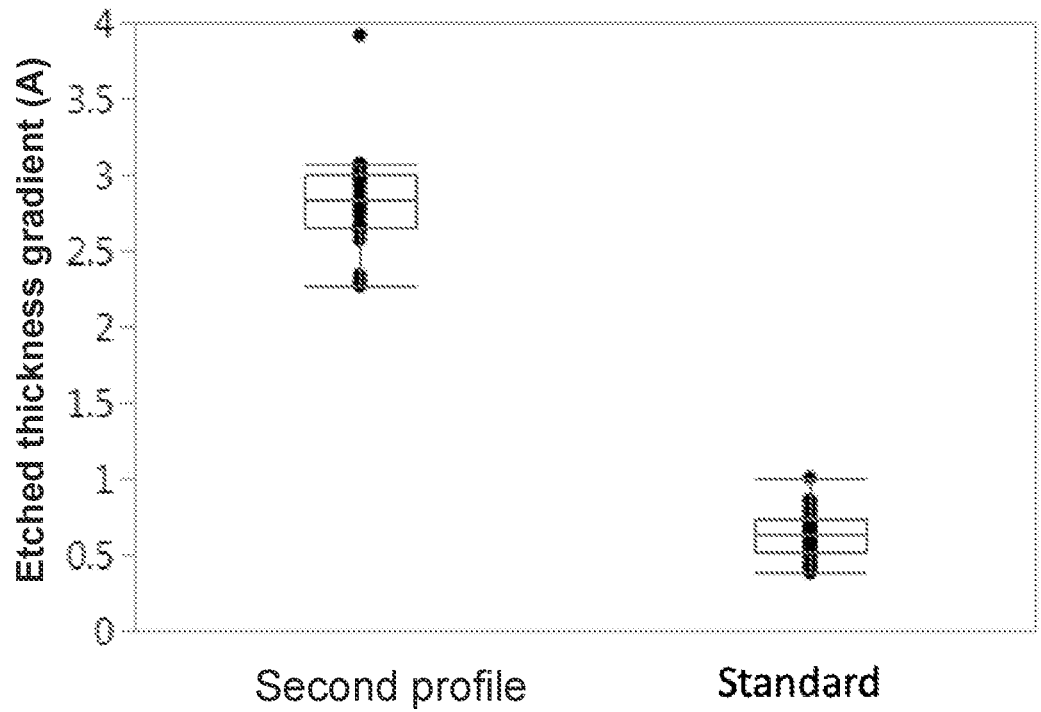
FIG. 6 shows a box diagram illustrating the etched thickness gradient in one example of non-uniform etching profiles obtained over a plurality of substrates treated with the etching method according to the present disclosure; the box diagram also illustrates the etched thickness gradient for a conventional use of the etching bath.

The reproducibility of this second profile was checked over a plurality of substrates 1 treated simultaneously in the etching bath 100. The graph in FIG. 6 shows the results of the thickness gradients (in angstroms) of the second profile in the form of a box plot, compared with the results obtained when the speeds of introduction and of removal are standard, i.e., greater than 25 cm/s.

There is clearly statistically found an etching gradient over the substrate 1, between the two points of introduction PII, PFI, that is equal on average to 2.8 A ("mean" in FIG. 6), with a standard deviation ("std Dev" in FIG. 6) on the order of 0.3 A.

Applying the second non-uniform etching profile to the particular substrate 1 exhibiting a non-uniformity of thickness such as that illustrated in FIG. 3, taking care to arrange the notch 22 at the final point of introduction PFI (and at the initial point of removal PIS), allows the uniformity of the thin layer 11 to be improved. Specifically, the second profile will allow greater thinning of the North region of the substrate 1 (initially the thickest region) with respect to its South region (initially the thinnest region). The initial non-uniformity of the thin layer 11 on the order of 0.6 nm thus goes to less than 0.4 nm by virtue of the etching method according to the present disclosure.

Note that the speed of introduction could also have been limited to between 25 cm/s and 0.1 cm/s in order to more finely adjust the differential removal between the two introduction or removal end points.

The etching method according to this preferred embodiment may easily be integrated into a cleaning sequence in a chemical-bath multi-wafer cleaning apparatus (or "wet bench"). For example, it may be integrated into a sequence of ozone/SC1/SC2 type, replacing the SC1 step or being inserted between the ozone step and the SC1 step. The straightforward integration of the etching method into a cleaning sequence is particularly advantageous because the rinsing and loading times for the batches of substrates 1 are shared and not multiplied by separating the stages.

The etching method according to the present disclosure is particularly suitable for correcting non-concentric-symmetry non-uniformities in the surface thin layer 11 of an SOI substrate 1, the thin layer 11 and the underlying intermediate layer 30 having a thickness of less than 50 nm.

Needless to say, the present disclosure is not limited to the embodiments and examples described, and variant implementations may be applied thereto without departing from the scope of the invention as defined by the claims.

While embodiments of the present disclosure have been described and illustrated with reference to preferred embodiments, in particular, the present disclosure may of course be transposed to a thin layer 11 made of a material other than monocrystalline silicon (for example, silicon oxide, etc.), and implement an etching bath solution other than SC1 (for example, hydrofluoric acid HF).

The invention claimed is:

1. A method for etching a main surface of a substrate comprising a surface thin layer, the main surface corresponding to a free face of the surface thin layer, the method comprising:
    immersing the substrate in an etching bath so as to expose the main surface to an etchant and then removing the substrate from the etching bath, the substrate being oriented with respect to the etching bath such that:
    as the substrate is introduced into the etching bath, the main surface is gradually immersed from an initial point of introduction (PII) to a final point of introduction (PFI), at a speed of introduction; and
    as the substrate is removed from the etching bath, the main surface gradually emerges from an initial point of removal (PIS) to a final point of removal (PFS), at a speed of removal;
    wherein:
        the speed of introduction is chosen so as to etch the main surface according to a first non-uniform profile between the initial point of introduction (PII) and the final point of introduction (PFI); and/or
        the speed of removal is chosen so as to etch the main surface according to a second non-uniform profile between the initial point of removal (PIS) and the final point of removal (PFS), in order to compensate for non-uniformities in thickness of the surface thin layer, and
    wherein the speed of introduction and/or the speed of removal are/is between 25 cm/s and 0.1 cm/s.

2. The method of claim 1, wherein:
    the first non-uniform profile defines a variation in thickness etched over the main surface, between the initial point of introduction (PII) and the final point of introduction (PFI), of greater than or equal to 0.15 nm; and/or
    the second non-uniform profile defines a variation in thickness etched over the main surface, between the initial point of removal (PIS) and the final point of removal (PFS), of greater than or equal to 0.15 nm.

3. The method of claim 2, wherein:
    the first non-uniform profile defines a variation in thickness etched over the main surface, between the initial point of introduction (PII) and the final point of introduction (PFI), of greater than or equal to 0.2 nm; and/or
    the second non-uniform profile defines a variation in thickness etched over the main surface, between the initial point of removal (PIS) and the final point of removal (PFS), of greater than or equal to 0.2 nm.

4. The method of claim 2, wherein the initial point of introduction (PII) corresponds to the final point of removal (PFS), and the final point of introduction (PFI) corresponds to the initial point of removal (PIS).

5. The method of claim 4, wherein the speed of introduction and/or the speed of removal are/is non-constant as the substrate is introduced into the etching bath and taken out of the etching bath, respectively.

6. The method of claim 5, wherein the etching bath contains an SC1 ("standard clean 1") solution, having ammonia, hydrogen peroxide and deionized water in proportions of 1/2/20, respectively.

7. The method of claim 6, wherein the surface thin layer is made of monocrystalline silicon.

8. The method of claim 6, wherein the substrate is an SOI substrate, and the surface thin layer has a thickness of less than 50 nm and is arranged on an insulating layer, which is arranged on a carrier substrate made of silicon.

9. The method of claim 8, wherein the surface thin layer is made of monocrystalline silicon.

10. The method of claim 1, wherein the initial point of introduction (PII) corresponds to the final point of removal (PFS), and the final point of introduction (PFI) corresponds to the initial point of removal (PIS).

11. The method of claim 1, wherein the speed of introduction and/or the speed of removal are/is between 10 cm/s and 0.5 cm/s.

12. The method of claim 1, wherein the etching bath contains an SC1 ("standard clean 1") solution, having ammonia, hydrogen peroxide and deionized water in proportions of 1/2/20, respectively.

13. A method for etching a main surface of a substrate comprising a surface thin layer, the main surface corresponding to a free face of the surface thin layer, the method comprising:
immersing the substrate in an etching bath so as to expose the main surface to an etchant and then removing the substrate from the etching bath, the substrate being oriented with respect to the etching bath such that:
as the substrate is introduced into the etching bath, the main surface is gradually immersed from an initial point of introduction (PII) to a final point of introduction (PFI), at a speed of introduction; and
as the substrate is removed from the etching bath, the main surface gradually emerges from an initial point of removal (PIS) to a final point of removal (PFS), at a speed of removal;
wherein:
the speed of introduction is chosen so as to etch the main surface according to a first non-uniform profile between the initial point of introduction (PII) and the final point of introduction (PFI); and/or
the speed of removal is chosen so as to etch the main surface according to a second non-uniform profile between the initial point of removal (PIS) and the final point of removal (PFS), in order to compensate for non-uniformities in thickness of the surface thin layer, and
wherein the speed of introduction and/or the speed of removal are/is non-constant as the substrate is introduced into the etching bath and taken out of the etching bath, respectively.

14. A method for etching a main surface of a substrate comprising a surface thin layer, the main surface corresponding to a free face of the surface thin layer, the method comprising:
immersing the substrate in an etching bath so as to expose the main surface to an etchant and then removing the substrate from the etching bath, the substrate being oriented with respect to the etching bath such that:
as the substrate is introduced into the etching bath, the main surface is gradually immersed from an initial point of introduction (PII) to a final point of introduction (PFI), at a speed of introduction; and
as the substrate is removed from the etching bath, the main surface gradually emerges from an initial point of removal (PIS) to a final point of removal (PFS), at a speed of removal;
wherein:
the speed of introduction is chosen so as to etch the main surface according to a first non-uniform profile between the initial point of introduction (PII) and the final point of introduction (PFI); and/or
the speed of removal is chosen so as to etch the main surface according to a second non-uniform profile between the initial point of removal (PIS) and the final point of removal (PFS), in order to compensate for non-uniformities in thickness of the surface thin layer, and
wherein the substrate is an SOI substrate, and the surface thin layer has a thickness of less than 50 nm and is arranged on an insulating layer, which is arranged on a carrier substrate made of silicon.

* * * * *